United States Patent
Lyles et al.

(10) Patent No.: US 8,704,525 B2
(45) Date of Patent: Apr. 22, 2014

(54) CURRENT BASED OVERVOLTAGE AND UNDERVOLTAGE DETECTOR

(75) Inventors: Umar J. Lyles, Palm Bay, FL (US); Karthik Kadirevel, Melbourne, FL (US); John H. Carpenter, Jr., Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 12/643,766

(22) Filed: Dec. 21, 2009

(65) Prior Publication Data

US 2011/0012605 A1 Jan. 20, 2011

Related U.S. Application Data

(60) Provisional application No. 61/226,997, filed on Jul. 20, 2009.

(51) Int. Cl.
*G01N 27/416* (2006.01)

(52) U.S. Cl.
USPC .................................................. 324/433

(58) Field of Classification Search
USPC .......... 320/116–123, 134, 136; 324/426, 433, 324/434
See application file for complete search history.

(56) References Cited

U.S. PATENT DOCUMENTS

| | | | |
|---|---|---|---|
| 4,560,937 A * | 12/1985 | Finger | 324/433 |
| 2006/0280511 A1 * | 12/2006 | Futami | 398/209 |
| 2009/0179650 A1 * | 7/2009 | Omagari | 324/433 |
| 2010/0194345 A1 * | 8/2010 | Li | 320/134 |
| 2010/0289497 A1 * | 11/2010 | Lum-Shue-Chan et al. | 324/426 |

OTHER PUBLICATIONS

Current-Mode Multiple Input Maximum Circuit for Fuzzy Logic Controllers, Electronics Letters Nov. 10, 1994, vol. 30, No. 23, pp. 1924-1925 (C.-Y. Huang and B.-D. Liu.
"Modular Current-Mode Multiple Input Minimum Circuit for Fuzzy Logic Controllers," Electronics Letters Jun. 6, 1996, vol. 32, No. 12, pp. 1067-1069 (Chun-Yueh Huang, Ching-Jone Wang and Bin-Da Liu).

* cited by examiner

*Primary Examiner* — Melissa Koval
*Assistant Examiner* — Daniel Miller
(74) *Attorney, Agent, or Firm* — Alan A. R. Cooper; W. James Brady, III; Frederick J. Teleky, Jr.

(57) ABSTRACT

With batteries or cells, particularly lithium ion cells, it is important to determine when one or more cells have entered a fault condition (i.e., overvoltage or undervoltage). Conventional circuits employ measuring circuits that use multiple bandgap circuits and high voltage components. These conventional circuits, however, consume a great deal of area because of the use of these multiple bandgap circuits and the high voltage components. Here, a circuit is provided that reduces the number of bandgap circuits and reduces the number of high voltage components, reducing the area consumed and reducing the overall cost of production compared to conventional circuits.

23 Claims, 2 Drawing Sheets

CURRENT BASED OVERVOLTAGE AND UNDERVOLTAGE DETECTOR

TECHNICAL FIELD

The invention relates generally to cell conditions and, more particularly, to measuring overvoltage and undervoltage of energy cells.

BACKGROUND

For batteries or cells, particularly lithium ion cells, it is important to measure the conditions of the cells. Generally, this means that there is circuitry in place to look for particular fault conditions, such as overvoltage and undervoltage. As can be seen FIG. 1, an example of a conventional circuit 100 can be seen, which measures fault conditions for cells.

In FIG. 1, there are several cells BAT0 to BAT2 that are coupled in series with one another. In this circuit 100, overvoltage and undervoltage conditions are measured. To accomplish this, each cell BAT0 to BAT2 employs a comparator 106-0 to 106-2 to (respectively) measure the whether the cell BAT0 to BAT2 has entered an overvoltage condition (which is indicated by signals OV0 to OV2) and employs a comparator 108-0 to 108-2 to (respectively) measure the whether the cell BAT0 to BAT2 has entered an undervoltage condition (which is indicated by signals UV0 to UV2). The levels for overvoltage are set by bandgap circuits 102-0 to 102-2, and the levels for undervoltage are set by bandgap circuits 104-0 to 104-2.

There are, however, numerous drawbacks to circuit 100. First, because there is direct measurement of the voltage of cells BAT0 to BAT2, high voltage elements (i.e., transistors) are required. Second, numerous bandgap circuits 102-0 to 102-2 and 104-0-104-2 are used. Each of the high voltage elements and bandgap circuit 102-0 to 102-2 and 104-0-104-2 consume a great deal of area, increasing the production costs of integrated circuits that measure fault conditions for cells.

Some other conventional circuits are: Huang et al., "Current Mode Multiple Input Maximum Circuit for Fuzzy Logic Controllers," *Electronics Letters*, Vol. 30, No. 24, pp. 1924-1925, 1994; and Huang et al., "Modular Current Mode Multiple Input Minimum Circuit for Fuzzy Logic Controllers" Electronics Letters, Vol. 32, No. 12, pp. 1067-1069, Jun. 1996.

SUMMARY

A preferred embodiment of the present invention, accordingly, provides an apparatus. The apparatus comprises a plurality of voltage-to-current converters, wherein each voltage-to-current converter receives an input voltage and generates an output current having a magnitude that is substantially proportional to the input voltage; a first current detector that is coupled to the plurality of voltage-to-current converters, wherein the first current detector determines which output current from the plurality of voltage-to-current converters is the largest current; an overvoltage detector that is coupled to the first current detector so as to receive the largest current and that compares the largest current to an overvoltage reference current, wherein the overvoltage detector generates an overvoltage signal indicating whether the largest current is greater than the overvoltage reference current; a second current detector that is coupled to the plurality of voltage-to-current converters, wherein the second current detector determines which output current from the plurality of voltage-to-current converters is the smallest current; and an undervoltage detector that is coupled to the first current detector so as to receive the smallest current and that compares the smallest current to an undervoltage reference current, wherein the undervoltage detector generates an undervoltage signal indicating whether the smallest current is less than the undervoltage reference current.

In accordance with a preferred embodiment of the present invention, each of the voltage-to-current converters further comprises a current mirror that receives its corresponding input voltage and that is coupled to the first current detector and the second current detector.

In accordance with a preferred embodiment of the present invention, each voltage-to-current converter further comprises: a first resistor that receives its corresponding input voltage; a switch that is coupled to the first resistor; and a second resistor that is coupled between the switch and the current mirror.

In accordance with a preferred embodiment of the present invention, the apparatus further comprises a controller that is coupled to each switch so as to actuate and deactuate each switch.

In accordance with a preferred embodiment of the present invention, the overvoltage detector further comprises a bandgap circuit that generates the overvoltage reference current.

In accordance with a preferred embodiment of the present invention, the undervoltage detector further comprises a bandgap circuit that generates the undervoltage reference current.

In accordance with a preferred embodiment of the present invention, an apparatus is provided. The apparatus comprises a plurality of cells coupled in series with one another, wherein each cell generates an input voltage; a plurality of voltage-to-current converters, wherein each voltage-to-current converter is coupled to at least one of the cells so as to generates an output current having a magnitude that is substantially to the input voltage of its corresponding cell; a first current detector that is coupled to the plurality of voltage-to-current converters, wherein the first current detector determines which output current from the plurality of voltage-to-current converters is the largest current; an overvoltage detector that is coupled to the first current detector so as to receive the largest current and that compares the largest current to an overvoltage reference current, wherein the overvoltage detector generates an overvoltage signal indicating whether the largest current is greater than the overvoltage reference current; a second current detector that is coupled to the plurality of voltage-to-current converters, wherein the second current detector determines which output current from the plurality of voltage-to-current converters is the smallest current; and an undervoltage detector that is coupled to the first current detector so as to receive the smallest current and that compares the smallest current to an undervoltage reference current, wherein the undervoltage detector generates an undervoltage signal indicating whether the smallest current is less than the undervoltage reference current.

In accordance with a preferred embodiment of the present invention, each cell further comprises a lithium ion cell.

In accordance with a preferred embodiment of the present invention, the apparatus further comprises: a plurality of capacitors, wherein each capacitor is coupled substantially in parallel to at least one of the cells; and a plurality of resistors, wherein each resistor is coupled between at least one of the cells and at least one of the voltage-to-current converters.

In accordance with a preferred embodiment of the present invention, an apparatus is provided. The apparatus comprises a plurality of cells coupled in series with one another, wherein each cell generates an input voltage; a plurality of capacitors, wherein each capacitor is coupled substantially in parallel to at least one of the cells; and a plurality of first resistors, wherein each first resistor is coupled to at least one of the cells; a plurality of voltage-to-current converters, wherein each voltage-to-current converter is coupled to at least one of the first resistors, and wherein each voltage-to-current converter includes: a first resistor that is coupled to its corresponding first resistor; a switch that is coupled to the second resistor; a third resistor that is coupled to the switch; and a current mirror that is coupled to the third resistor; a first current detector that is coupled to the current mirror from each voltage-to-current converter, wherein the first current detector determines which output current from the plurality of voltage-to-current converters is the largest current; an overvoltage detector including: a first reference current source that generates an overvoltage reference current; and a first current comparator that is coupled to the first current detector and the first reference current source so as to compare the largest current to the overvoltage reference current; a second current detector that is coupled to the current mirror from each voltage-to-current converter, wherein the second current detector determines which output current from the plurality of voltage-to-current converters is the smallest current; and an undervoltage detector including: a second reference current source that generates an undervoltage reference current; and a second current comparator that is coupled to the second current detector and the second reference current source so as to compare the smallest current to the undervoltage reference current.

In accordance with a preferred embodiment of the present invention, the apparatus further comprises a controller that is coupled to each switch so as to actuate and deactuate each switch.

In accordance with a preferred embodiment of the present invention, the first reference current source further comprises a bandgap circuit that generates the overvoltage reference current.

In accordance with a preferred embodiment of the present invention, the second reference current source further comprises a bandgap circuit that generates the undervoltage reference current.

In accordance with a preferred embodiment of the present invention, the first reference current source further comprises a reference current source that generates the overvoltage reference current or the undervoltage reference current.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
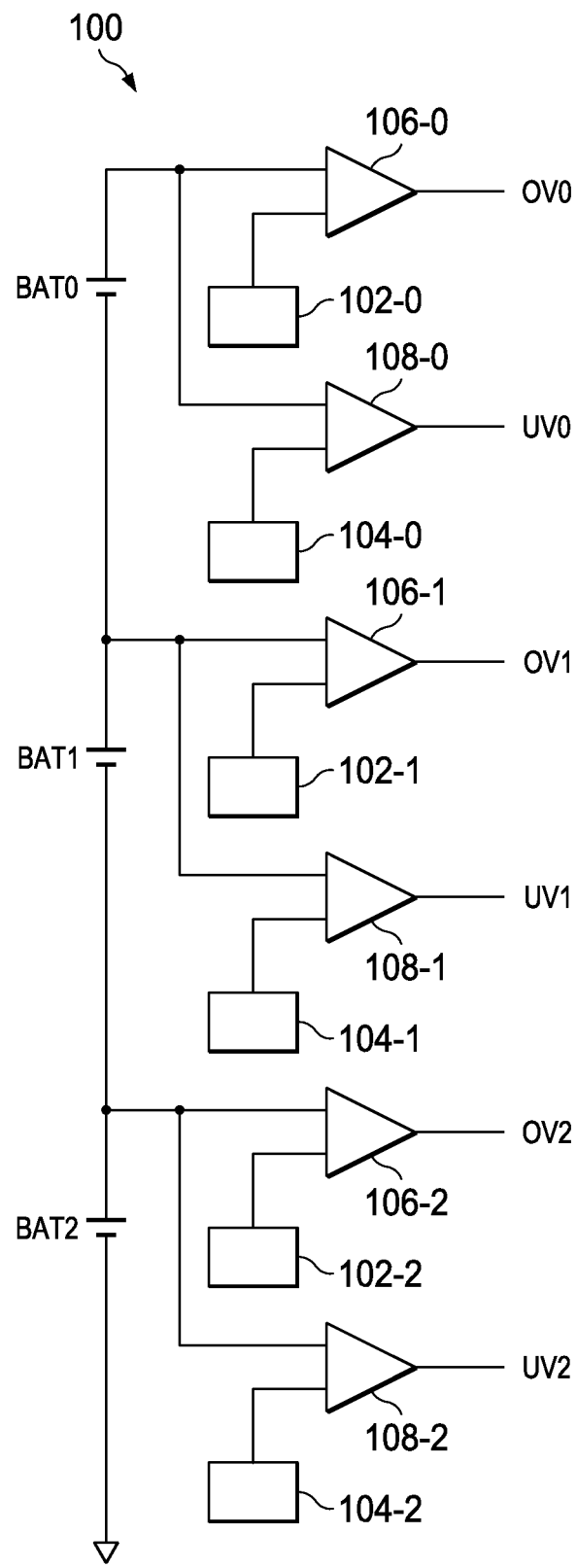
FIG. 1 is an example of a conventional circuit used for measuring fault conditions for cells.

Refer now to the drawings wherein depicted elements are, for the sake of clarity, not necessarily shown to scale and wherein like or similar elements are designated by the same reference numeral through the several views.

Figure 2:
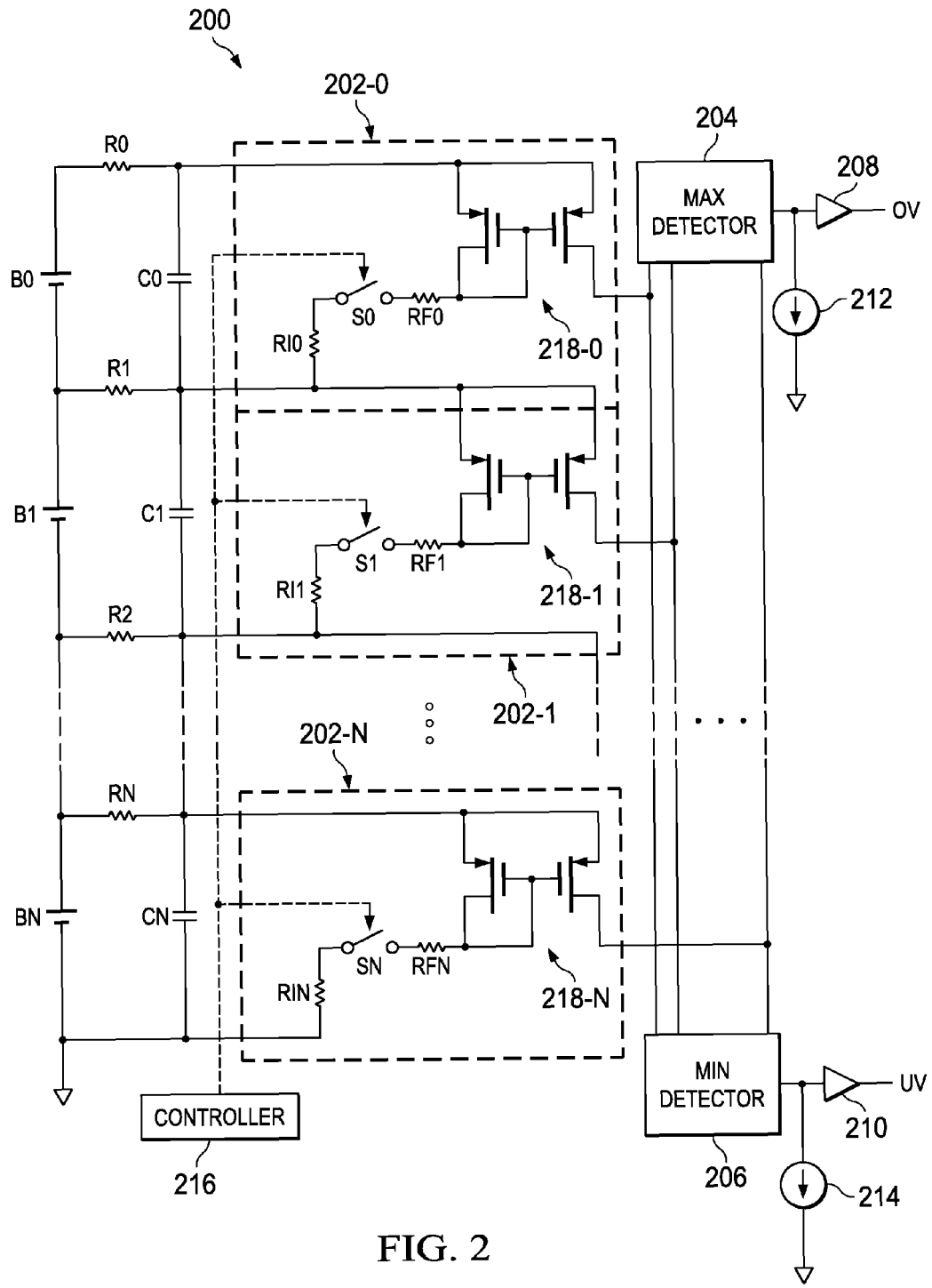
FIG. 2 is an example of a circuit in accordance with a preferred embodiment of the present invention.

Tuning to FIG. 2, an example of a circuit 200 for measuring and detecting overvoltage and undervoltage conditions in accordance with a preferred embodiment of the present invention can be seen. In this configuration, cells B0 to BN (which are preferably lithium ion cells) are coupled in series with one another. Coupled to each cell B0 to BN are resistors R0 to RN (respectively), and coupled generally in parallel to cells B0 to BN are capacitors C0 to CN. Circuit 200 is, then, coupled to this arrangement of resistors R0 to RN, capacitors C0 to CN, and cells B0 to BN to measure and detect the overvoltage and undervoltage conditions.

Circuit 200 is generally comprised of voltage-to-current converters 202-0 to 202-N. These converters 202-0 to 202-N are generally (respectively) comprised of resistors RI0 to RIN and RF0 to RFN, switches S0 to SN, and current mirrors 218-0 to 218-N. The current mirrors 218-0 to 218-N are also generally comprised of PMOS transistors (but may also be any other type of current mirroring device). Each of converters 202-0 to 202-N is coupled to cell B0 to BN (respectively) to convert the voltage level on or input voltage from its corresponding cell B0 to BN to a current that is generally proportional to the input voltage from its corresponding cell B0 to BN. By using the converters 202-0 to 202-N, low voltage components can be employed. Additionally, controller 216 is coupled to each of switches S0 to SN so as to be able to actuate and deactuate each, thus, enabling one to activate and deactivate converters 202-0 to 202-N as desired. Also, by employing switches S0 to SN, current is reused by converters 202-1 to 202-N, and overall power consumption is reduced compared to other conventional circuits.

Coupled to each of the current mirrors 218-0 to 218-N is a maximum detector 204 and a minimum detector 206. The maximum detector 204 is a multi-port current comparator that determines which of the currents from current mirrors 218-0 to 218-N is the largest. This largest current is provided to current comparator 208 (which compares it to an overvoltage reference current generated by current source or bandgap reference circuit 212) to generate an overvoltage signal OV. The minimum detector 206 is also a multi-port current comparator that determines which of the currents from current mirrors 218-0 to 218-N is the smallest. This smallest current is provided to current comparator 210 (which compares it to an undervoltage reference current generated by current source or bandgap reference circuit 214) to generate an undervoltage signal UV. The reason for having is arrangement is that (for most applications) knowledge of the particular cell B0 to BN that has entered a fault condition (i.e., overvoltage or undervoltage) is immaterial; one simple needs to detect whether any of the cells B0 to BN has entered the fault condition, which is accomplished by circuit 200.

This arrangement shown in FIG. 2 also has numerous advantages over other conventional circuits. Namely, a single bandgap circuit (i.e., current sources 212 and 214) can be employed for each of overvoltage and undervoltage detection, irrespective of the number of cells, leading to less area being consumed. Additionally, because a signal bandgap circuit can be employed for each of overvoltage and undervoltage detection, there is better accuracy over a wide range of temperatures.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a plurality of voltage-to-current converters, wherein each voltage-to-current converter receives an input voltage and generates an output current having a magnitude that is substantially proportional to the input voltage;
   a first current detector that is coupled to the plurality of voltage-to-current converters, wherein the first current detector determines which output current from the plurality of voltage-to-current converters is the largest current;
   an overvoltage detector that is coupled to the first current detector so as to receive the largest current and that compares the largest current to an overvoltage reference current, wherein the overvoltage detector generates an overvoltage signal indicating whether the largest current is greater than the overvoltage reference current;
   a second current detector that is coupled to the plurality of voltage-to-current converters, wherein the second current detector determines which output current from the plurality of voltage-to-current converters is the smallest current; and
   an undervoltage detector that is coupled to the second current detector so as to receive the smallest current and that compares the smallest current to an undervoltage reference current, wherein the undervoltage detector generates an undervoltage signal indicating whether the smallest current is less than the undervoltage reference current,
   wherein the first current detector is distinct from the overvoltage detector; and
   wherein the second current detector is distinct from the undervoltage detector.

2. The apparatus of claim 1, wherein each of the voltage-to-current converters further comprises a current mirror that receives its corresponding input voltage and that is coupled to the first current detector and the second current detector.

3. The apparatus of claim 2, wherein each voltage-to-current converter further comprises:
   a first resistor that receives its corresponding input voltage;
   a switch that is coupled to the first resistor; and
   a second resistor that is coupled between the switch and the current mirror.

4. The apparatus of claim 3, wherein the apparatus further comprises a controller that is coupled to each switch so as to actuate and deactuate each switch.

5. The apparatus of claim 1, wherein the overvoltage detector further comprises a bandgap circuit that generates the overvoltage reference current.

6. The apparatus of claim 1, wherein the undervoltage detector further comprises a bandgap circuit that generates the undervoltage reference current.

7. The apparatus of claim 1, wherein the first current detector and the second current detector are configured to be on for a concurrent time sequence.

8. An apparatus comprising:
   a plurality of cells coupled in series with one another, wherein each cell generates an input voltage;
   a plurality of voltage-to-current converters, wherein each voltage-to-current converter is coupled to at least one of the cells so as to generate an output current having a magnitude that is substantially proportional to the input voltage of its corresponding cell;
   a first current detector that is coupled to the plurality of voltage-to-current converters, wherein the first current detector determines which output current from the plurality of voltage-to-current converters is the largest current;
   an overvoltage detector that is coupled to the first current detector so as to receive the largest current and that compares the largest current to an overvoltage reference current, wherein the overvoltage detector generates an overvoltage signal indicating whether the largest current is greater than the overvoltage reference current;
   a second current detector that is coupled to the plurality of voltage-to-current converters, wherein the second current detector determines which output current from the plurality of voltage-to-current converters is the smallest current; and
   an undervoltage detector that is coupled to the second current detector so as to receive the smallest current and that compares the smallest current to an undervoltage reference current, wherein the undervoltage detector generates an undervoltage signal indicating whether the smallest current is less than the undervoltage reference current,
   wherein the first current detector is distinct from the overvoltage detector; and
   wherein the second current detector is distinct from the undervoltage detector.

9. The apparatus of claim 8, wherein each of the voltage-to-current converters further comprises a current mirror that receives its corresponding input voltage and that is coupled to the first current detector and the second current detector.

10. The apparatus of claim 9, wherein each voltage-to-current converter further comprises:
    a first resistor that receives its corresponding input voltage;
    a switch that is coupled to the first resistor; and
    a second resistor that is coupled between the switch and the current mirror.

11. The apparatus of claim 10, wherein the apparatus further comprises a controller that is coupled to each switch so as to actuate and deactuate each switch.

12. The apparatus of claim 8, wherein the overvoltage detector further comprises a bandgap circuit that generates the overvoltage reference current.

13. The apparatus of claim 8, wherein the undervoltage detector further comprises a bandgap circuit that generates the undervoltage reference current.

14. The apparatus of claim 8, wherein each cell further comprises a lithium ion cell.

15. The apparatus of claim 8, wherein the apparatus further comprises:
    a plurality of capacitors, wherein each capacitor is coupled substantially in parallel to at least one of the cells; and
    a plurality of resistors, wherein each resistor is coupled between at least one of the cells and at least one of the voltage-to-current converters.

16. The apparatus of claim 8, wherein the first current detector and the second current detector are configured to be on for a concurrent time sequence.

17. An apparatus comprising:
- a plurality of cells coupled in series with one another, wherein each cell generates an input voltage;
- a plurality of capacitors, wherein each capacitor is coupled substantially in parallel to at least one of the cells; and
- a plurality of first resistors, wherein each first resistor is coupled to at least one of the cells;
- a plurality of voltage-to-current converters, wherein each voltage-to-current converter is coupled to at least one of the first resistors, and wherein each voltage-to-current converter includes:
  - a second resistor that is coupled to its corresponding first resistor;
  - a switch that is coupled to the second resistor;
  - a third resistor that is coupled to the switch; and
  - a current mirror that is coupled to the third resistor;
- a first current detector that is coupled to the current mirror from each voltage-to-current converter, wherein the first current detector determines which output current from the plurality of voltage-to-current converters is the largest current;
- an overvoltage detector including:
  - a first reference current source that generates an overvoltage reference current; and
  - a first current comparator that is coupled to the first current detector and the first reference current source so as to compare the largest current to the overvoltage reference current;
- a second current detector that is coupled to the current mirror from each voltage-to-current converter, wherein the second current detector determines which output current from the plurality of voltage-to-current converters is the smallest current; and
- an undervoltage detector including:
  - a second reference current source that generates an undervoltage reference current; and
  - a second current comparator that is coupled to the second current detector and the second reference current source so as to compare the smallest current to the undervoltage reference current,
- wherein the first current detector is distinct from the overvoltage detector; and
- wherein the second current detector is distinct from the undervoltage detector.

18. The apparatus of claim 17, wherein the apparatus further comprises a controller that is coupled to each switch so as to actuate and deactuate each switch.

19. The apparatus of claim 17, wherein the first reference current source further comprises a bandgap circuit that generates the overvoltage reference current.

20. The apparatus of claim 17, wherein the second reference current source further comprises a bandgap circuit that generates the undervoltage reference current.

21. The apparatus of claim 17, wherein each cell further comprises a lithium ion cell.

22. The apparatus of claim 17, wherein the first reference current source further comprises a reference current source that generates the overvoltage reference current or the undervoltage reference current.

23. The apparatus of claim 17, wherein the first current detector and the second current detector are configured to be on for a concurrent time sequence.

* * * * *